United States Patent
Bowles

(10) Patent No.: US 8,709,868 B2
(45) Date of Patent: Apr. 29, 2014

(54) SENSOR PACKAGES AND METHOD OF PACKAGING DIES OF DIFFERING SIZES

(75) Inventor: Philip H. Bowles, Fountain Hills, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/592,764

(22) Filed: Aug. 23, 2012

(65) Prior Publication Data

US 2014/0054798 A1 Feb. 27, 2014

(51) Int. Cl.
*H01L 21/00* (2006.01)

(52) U.S. Cl.
USPC ........... 438/107; 438/455; 438/458; 438/460; 438/113; 438/118; 438/127; 257/723; 257/784

(58) Field of Classification Search
None
See application file for complete search history.

(56) References Cited

U.S. PATENT DOCUMENTS

| | | | |
|---|---|---|---|
| 6,838,776 B2 | 1/2005 | Leal et al. | |
| 6,921,975 B2 | 7/2005 | Leal et al. | |
| 7,419,853 B2 | 9/2008 | Kuhmann et al. | |
| 7,446,017 B2 | 11/2008 | Liu et al. | |
| 7,858,440 B2 | 12/2010 | Pressel et al. | |
| 7,868,729 B2 | 1/2011 | Wang et al. | |
| 8,124,435 B2 | 2/2012 | Kuisma | |
| 8,154,126 B2 | 4/2012 | Voelz | |
| 2006/0189033 A1* | 8/2006 | Kim | 438/109 |
| 2006/0216857 A1 | 9/2006 | Zhao | |
| 2007/0290364 A1* | 12/2007 | Gupta et al. | 257/777 |
| 2011/0018084 A1 | 1/2011 | Shim et al. | |
| 2011/0221042 A1 | 9/2011 | Karlin et al. | |
| 2011/0250721 A1 | 10/2011 | Bowles et al. | |
| 2011/0300669 A1* | 12/2011 | Shen et al. | 438/107 |

FOREIGN PATENT DOCUMENTS

| | | |
|---|---|---|
| WO | 02056031 A1 | 7/2002 |
| WO | 2007017757 A2 | 2/2007 |

* cited by examiner

*Primary Examiner* — Julio J Maldonado
*Assistant Examiner* — Molly Reida
(74) *Attorney, Agent, or Firm* — Schmeiser, Olsen & Watts LLP; Lowell W. Gresham; Charlene R. Jacobsen

(57) ABSTRACT

A method (90) entails placing (124) sensor elements (122) in an array (126) arranged to correspond with locations of controller dies (24) in a controller wafer (94) and encapsulating (128) the array (126) in a mold material (74) to form a panel (130) of the sensor elements (122). The sensor elements (122) include bond pads (42) that are concealed by a material section (116, 118) of the sensor elements (122). The controller wafer (94) is bonded (134) to the panel (130) to form a stacked wafer structure (136). After bonding, methodology (90) entails forming (140) conductive elements (60) on the controller wafer (95), removing material sections (100) from the controller wafer (94) and removing the material sections (116, 118) from the sensor elements (122) to expose the bond pads (42), forming (148) electrical interconnects (56), applying (152) packaging material (64), and singulating to produce sensor packages (20, 76).

18 Claims, 11 Drawing Sheets

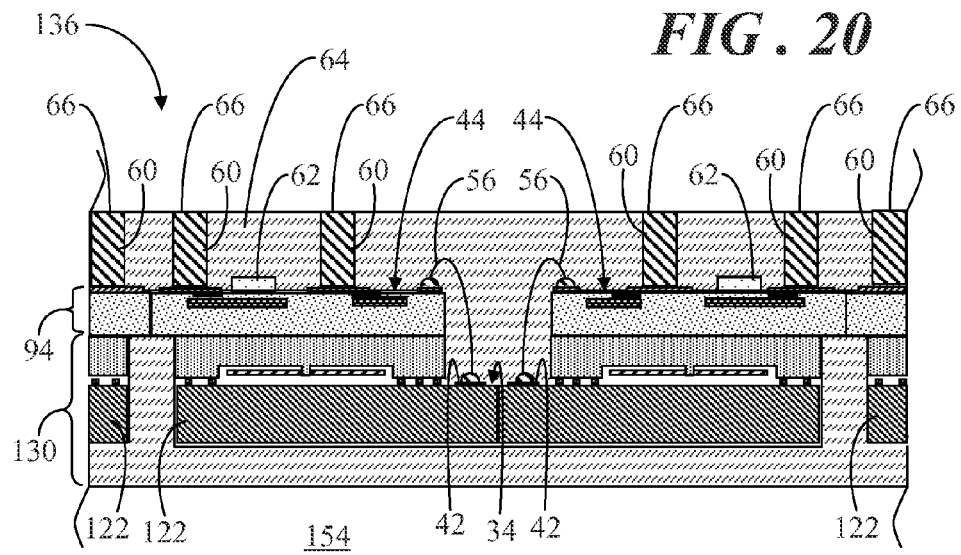
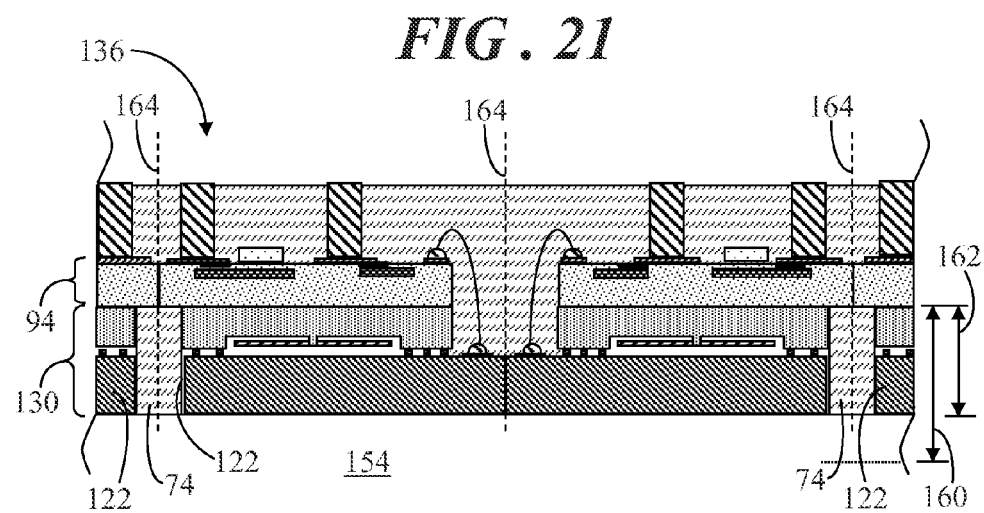
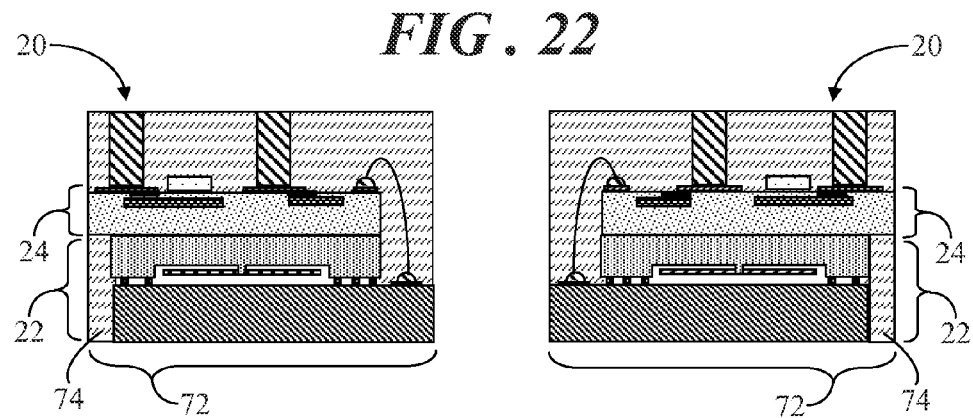

US 8,709,868 B2

SENSOR PACKAGES AND METHOD OF PACKAGING DIES OF DIFFERING SIZES

TECHNICAL FIELD OF THE INVENTION

The present invention relates generally to semiconductor packaging. More specifically, the present invention relates to wafer level semiconductor packaging for forming sensor packages in which semiconductor dies are of differing sizes.

BACKGROUND OF THE INVENTION

Microelectronic device technology has achieved wide popularity in recent years, as it provides a way to make very small electronic and mechanical structures and integrate these structures on a single substrate using conventional batch semiconductor processing techniques. While such microelectronic devices are becoming mainstream technologies, cost effectively packaging them in semiconductor packages for manufacture and ease of use remains challenging. Indeed, packaging is one of the major cost drivers for such devices.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

FIG. 20 shows a partial side sectional view of the stacked wafer structure of FIG. 19 at a subsequent stage of packaging;

FIG. 21 shows a partial side sectional view of the stacked wafer structure of FIG. 20 at a subsequent stage of packaging;

FIG. 22 shows a side sectional view of sensor packages produced from the stacked wafer structure of FIG. 21 in accordance with the packaging process of FIG. 4;

DETAILED DESCRIPTION

Figure 1:
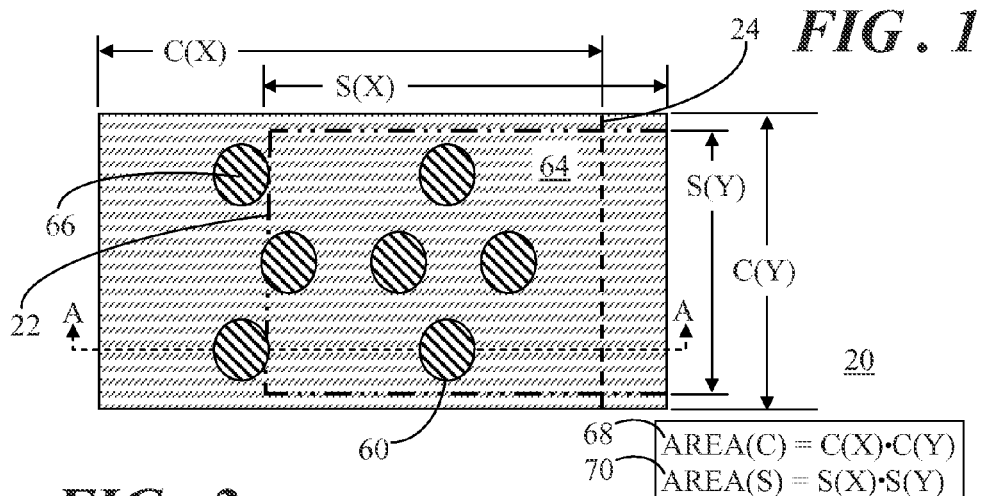
FIG. 1 shows a top view of an exemplary sensor package in accordance with an embodiment.

Semiconductor packages generally provide a set of related elements. These elements include, in some examples, one or more semiconductor devices to be packaged, interconnection from the devices to the package, a surrounding or containing structure to provide both mechanical support and electrical, chemical, and environmental protection, and a joining structure to attach the package to the board or system. The challenges faced by developers of semiconductor packaging processes result from, for example, the sensitivity of the semiconductor devices (e.g., microelectronics and microstructures) to high temperature processes, the need for suitable shielding, the requirement in some instances for a hermetic or near-hermetic seal to protect the devices from contaminants, and so forth. Due at least in part to these challenges, packaging is one of the major cost drivers for such devices.

One or more of the semiconductor devices in a semiconductor package may be a microelectronic sensor (e.g., a magnetometer), a microelectromechanical systems (MEMS) sensor (e.g., an accelerometer, gyroscope, pressure sensor), or some other miniaturized sensor. With regard to such sensors, proper packaging is important to ensure the integrity of the signals to and from the sensor devices. For example, angular misalignment of a sensor device or multiple sensor devices in a sensor package can lead to inaccuracies in the measured signals. As such, precise angular alignment of sensors in a sensor package is critical for receiving accurate measurements.

Angular alignment of sensors in traditional chip level packaging is currently limited to approximately plus or minus two degrees of accuracy. The angular alignment accuracy is limited by the tolerance of placement equipment utilized in die placement techniques. More precise angular alignment is being called for in the industry to improve the accuracy of measurements received from such sensors. As integrated circuit (IC) device geometries continue to decrease, the use of miniaturized sensor devices continues to rise, and the fabrication of semiconductor packages containing multiple microelectronic components continue to evolve, the need for low cost, accurate, reliable, high density packaging solutions increases.

Embodiments entail sensor packaging methodology and sensor packages produced in accordance with the packaging methodology. The packaging methodology involves a wafer-level packaging technique in lieu of traditional die-to-die placement techniques. Wafer-level packaging refers to packaging semiconductor devices at wafer level, and essentially extends the wafer fabrication process to include device interconnection and device protection processes. The wafer-level packaging process discussed herein provides high-throughput and precise placement packaging of sensors at relatively low cost. Additional advantages entail a chip-scale packaging technology that results in the sensor package being generally the same size as the die, stacking of sensors and microelectronic devices for size reduction, packaging of sensors and microelectronic devices of differing sizes, improved electrical performance, and so forth. The subsequent discussion pertains to the packaging of sensors. However, the packaging methodology discussed herein can be implemented to package various types of electronic components.

Figure 2:
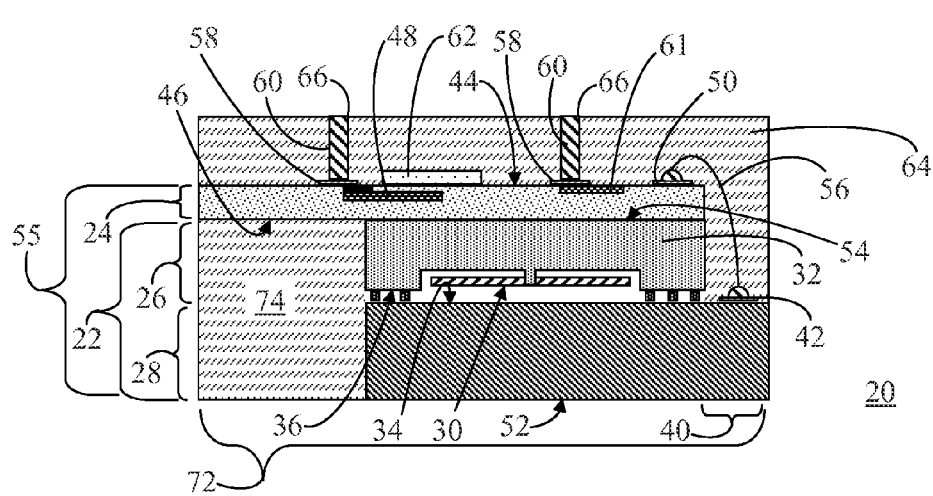
FIG. 2 shows a side view of the sensor package along section lines A-A in FIG. 1.

Referring now to FIGS. 1 and 2, FIG. 1 shows a top view of an exemplary electronic component package, referred to herein as a sensor package 20, in accordance with an embodiment, and FIG. 2 shows a side view of sensor package 20 along section lines A-A in FIG. 1. In general, sensor package 20 includes a first electronic component, referred to herein as a sensor structure 22, and a semiconductor die in the form of a second electronic component, referred to herein as a controller die 24 bonded to sensor structure 22. The various FIGS. 1-3 and 5-27 are illustrated using various shading and/or hatching to distinguish the different elements of the sensor packages for clarity of illustration. These different elements may be produced utilizing current and upcoming micromachining techniques. Although electronics packages and packaging methodology are described in connection with sensor packages that include sensor structure 22 and controller die 24, it should be understood that the first and second electronic components can encompass various types of electronic components to be packaged, and especially in scenarios in which precise angular alignment of the electronic components is required.

Sensor structure 22 includes a sensor die 26, a cap 28, and a sensor 30 formed on or in a substrate material 32 of sensor die 26. An inner surface 34 of cap 28 is coupled to an inner surface 36 of sensor die 26 with sensor 30 being interposed between sensor die 26 and cap 28. Thus, inner surface 34 of cap 28 is referred to hereinafter as inner cap surface 34 and inner surface 36 of sensor die 26 is referred to hereinafter as inner die surface 36. Sensor 30 may be a microelectromechanical systems (MEMS) sensor device such as an accelerometer, gyroscope, or some other sensor. However, sensor 30 need not be limited to a MEMS sensor configuration. Rather, sensor 30 may be an optical device, electro-magnetic device, chemical device, or some other sensor device that contains micron and/or sub-micron sized components. Additionally, although sensor 30 is mentioned in singular form, in alternative embodiments, sensor die 26 may include more than one sensor device formed on or in substrate material 32.

Cap 28 generally covers sensor die 26 so as to encapsulate sensor 30 and/or provide appropriate covering. In the embodiment shown, cap 28 may be attached to sensor die 26, for example, by a seal ring, so as to seal sensor 30 hermetically or near-hermetically within the encapsulated area. In some embodiments, cap 28 may include a cavity (not shown) extending inwardly from inner cap surface 34 so as to provide clearance for the moving elements of sensor 30, although such a configuration is not a limitation. In the illustrated embodiment shown in FIG. 2, cap 28 includes a substrate portion 40 exposed from sensor die 26. That is, a material section of sensor die 26 does not cover, i.e., is absent from, substrate portion 40 of cap 28. Bond pads 42 are formed on inner cap surface 34 of cap 28 at substrate portion 40. Accordingly, bond pads 42 formed on inner cap surface 34 of cap 28 are located outside the area sealed by cap 28. Bond pads 42 may be electrically connected to various structures and/or electrodes of sensor 30 in accordance with conventional and evolving sensor device manufacturing processes. The electrical interconnections of bond pads 42 with the structures and/or electrodes of sensor 30 are not illustrated or described in detail herein for brevity of discussion.

Controller die 24 has a top side 44 and a bottom side 46 opposing top side 44. In FIG. 2, top side 44 is shown as being physically positioned above bottom side 46. Hence, the distinguishing terms "top" and "bottom" are utilized herein. Top side 44 includes control circuitry 48 and bond pads 50 formed thereon. Control circuitry 48 may be any active or passive circuitry used in the "active area" of controller die 24 for communicating signals to and from sensor 30, for processing data from the sensor, for communicating with circuitry outside of sensor package 20, and so forth.

Sensor structure 22 includes an outer surface 52 which corresponds to the outer, or external, surface of cap 28. Thus, outer surface 52 is referred to hereinafter as outer cap surface 52 for clarity. Sensor structure 22 further includes an opposing outer surface 54 which corresponds to the outer, or external, surface of sensor die 26. Thus, outer surface 54 is referred to hereinafter as outer die surface 54 for clarity. In the illustrated embodiment, bottom side 46 of controller die 24 is attached to outer die surface 54 of sensor structure 22 to produce a stacked structure 55 having sensor die 26 positioned between cap 28 and controller die 24.

In sensor structure 22, bond pads 42 on inner cap surface 34 of substrate portion 40 of cap 28 face in the same direction (i.e., upwardly in FIG. 2) as top side 44 of controller die 24 upon which bond pads 50 are located. Electrical interconnects, referred to herein as bond wires 56, are readily attached between corresponding bond pads 42 on inner cap surface 34 of cap 28 and bond pads 50 on top side 44 of controller die 24 to provide suitable electrical interconnections between controller die 24 and sensor die 26 of sensor structure 22.

Controller die 24 further includes bump pads 58 formed on and distributed across top side 44. In an embodiment, conductive elements 60 are formed on bump pads 58 after controller die 24 is bonded to sensor structure 22. Conductive elements 60 are illustrated in FIG. 1 as being a circular shape in cross-section. However, conductive elements 60 may have different shapes in cross-section in accordance with particular design criteria. Conductive elements 60 may be pillars, balls, plugs, or some other conductive features that extend above bump pads 58. Conductive elements 60 are utilized as input/output elements for sensor package 20.

In some embodiments, an integral sensor 61 may be formed integrally with the passive and active elements of control circuitry 48 within controller die 24 in accordance with conventional and upcoming semiconductor manufacturing processes. In lieu of or in addition to integral sensor 61, sensor package 20 may include a sensor die 62 mounted on top side 44 of controller die 24. In an embodiment, integral sensor 61 or sensor die 62 may be a magnetometer for measuring the strength or direction of magnetic fields. However, integral sensor 61 and/or sensor die 62 may be some other sensor device in accordance with particular design criteria for sensor package 20.

A packaging material 64 is applied over top side 44 of controller die 24 to encapsulate control circuitry 48, bond wires 56, sensor die 62, and to at least partially encapsulate conductive elements 60 so that only a top side 66 of conductive elements 60 is exposed from packaging material 64. Packaging material 64 may be any conventional molding compound such as, for example, an epoxy resin material.

In the top view of FIG. 1, an outline of sensor structure 22 is shown in dash-dot line form and an outline of controller die 24 is shown in dashed line form. In many situations, the X and Y dimensions of sensor structure 22 and controller die 24 may not be generally equivalent. This situation is illustrated in FIG. 1 where a surface area 68, labeled AREA(C), of controller die 24 is a product of its length in the X direction, labeled C(X), and its length in the Y direction, labeled C(Y). And, a surface area 70, labeled AREA(S), of sensor structure 22 is a product of its length in the X direction, labeled S(X), and its length in the Y direction, labeled S(Y). In this example, surface area 68 is greater than surface area 70. It is not practical or cost effective to increase the size of sensor structure 22 to match controller die 24 when surface area 70 of sensor structure 22 is less than surface area 68 of controller die 24.

Accordingly, an embodiment described herein entails methodology that cost effectively addresses the problem of a mismatch in surface area 68 of controller die 24 and surface area 70 of sensor structure 22. Referring again to FIG. 2, as will be discussed in detail below, the methodology entails forming a composite sensor structure 72 that is a combination of sensor structure 22 and a mold material 74. Composite sensor structure 72 is produced to effectively match the footprint, i.e., surface area 68, of controller die 24 so that controller die 24 and composite sensor structure 72 can be coupled to form sensor package 20.

Figure 3:
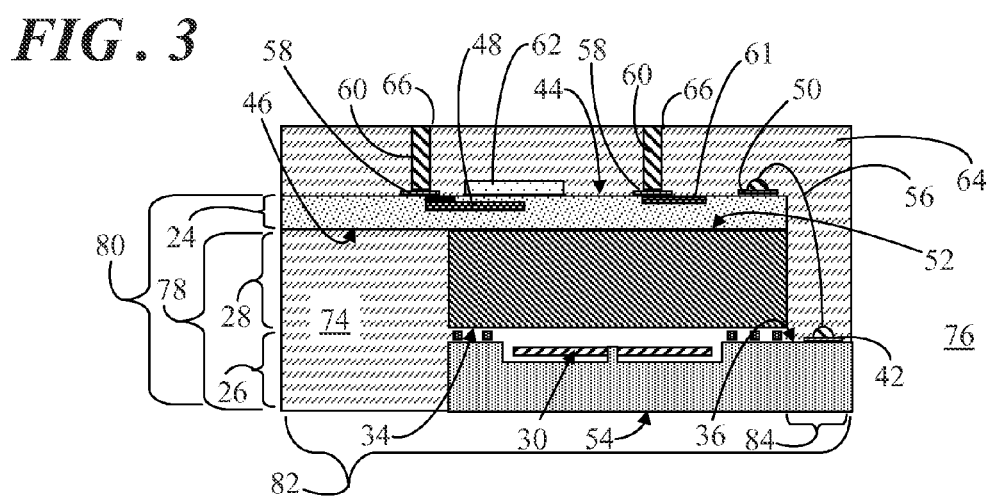
FIG. 3 shows a side view of a sensor package along section lines A-A in FIG. 1 in accordance with another embodiment.

FIG. 3 shows a side view of a sensor package 76 along section lines A-A in FIG. 1 in accordance with another embodiment. Sensor package 76 is similar to sensor package 20 (FIG. 2). Accordingly, sensor package 76 includes controller die 24 bonded to a sensor structure 78 to produce a stacked structure 80, where sensor structure 78 is made up of sensor die 26, cap 28, and sensor 30. Like sensor package 20, sensor package 76 additionally includes bond wires 56 electrically interconnecting sensor structure 78 with controller die 24, conductive elements 60, integral sensor 61 and/or sensor die 62, and so forth encapsulated by packaging material 64. In addition, a composite sensor structure 82 that is a combination of sensor structure 78 and mold material 74 is formed in accordance with methodology described below so that composite sensor structure 82 effectively matches the footprint, i.e., surface area 68 of controller die 24 so that controller die 24 and composite sensor structure 82 can be coupled to form sensor package 76.

As particularly illustrated in FIG. 3, a distinguishing feature of sensor package 76 is that sensor die 26 includes a substrate portion 84 exposed from cap 28. That is, a material section of cap 28 does not cover, i.e., is absent from, substrate portion 84 of sensor die 26. Hence, in lieu of being formed on inner cap surface 34 of cap 28 (as shown in FIG. 2), bond pads 42 are formed on inner die surface 36 of sensor die 26 at substrate portion 84. Accordingly, bond pads 42 are located outside the area of sensor die 26 sealed by cap 28. As in the embodiment of FIG. 2, bond pads 42 may be electrically connected to various structures and/or electrodes of sensor 30 in accordance with conventional and evolving sensor device manufacturing processes. The electrical interconnections of bond pads 42 with the structures and/or electrodes of sensor 30 are not illustrated or described in detail herein for brevity of discussion.

Another distinguishing feature of sensor package 76, as also illustrated in FIG. 3, is that bottom side 46 of controller die 24 is attached to outer cap surface 52 of sensor structure 78 to produce stacked structure 80 having cap 28 positioned between sensor die 26 and controller die 24. Accordingly, bond pads 42 on inner die surface 36 of substrate portion 84 of sensor die 26 face in the same direction (i.e., upwardly in FIG. 3) as top side 44 of controller die 24 upon which bond pads 50 are located. Bond wires 56 are readily attached between corresponding bond pads 42 on inner die surface 36 of sensor die 26 and bond pads 50 on top side 44 of controller die 24 to provide suitable electrical interconnections between controller die 24 and sensor die 26 of sensor structure 78.

As discussed above, sensor package 20 (FIG. 2) represents a structural configuration in which sensor die 26 is interposed between cap 28 and controller die 24. Whereas, sensor package 76 represents a flipped structural configuration in which cap 28 is interposed between sensor die 26 and controller die 24. Sensor packages 20 and 76 are provided herein for exemplary purposes. However, the sensor packages may take on a wide variety of forms, sizes, shapes, and functions in accordance with particular design criteria.

Figure 4:
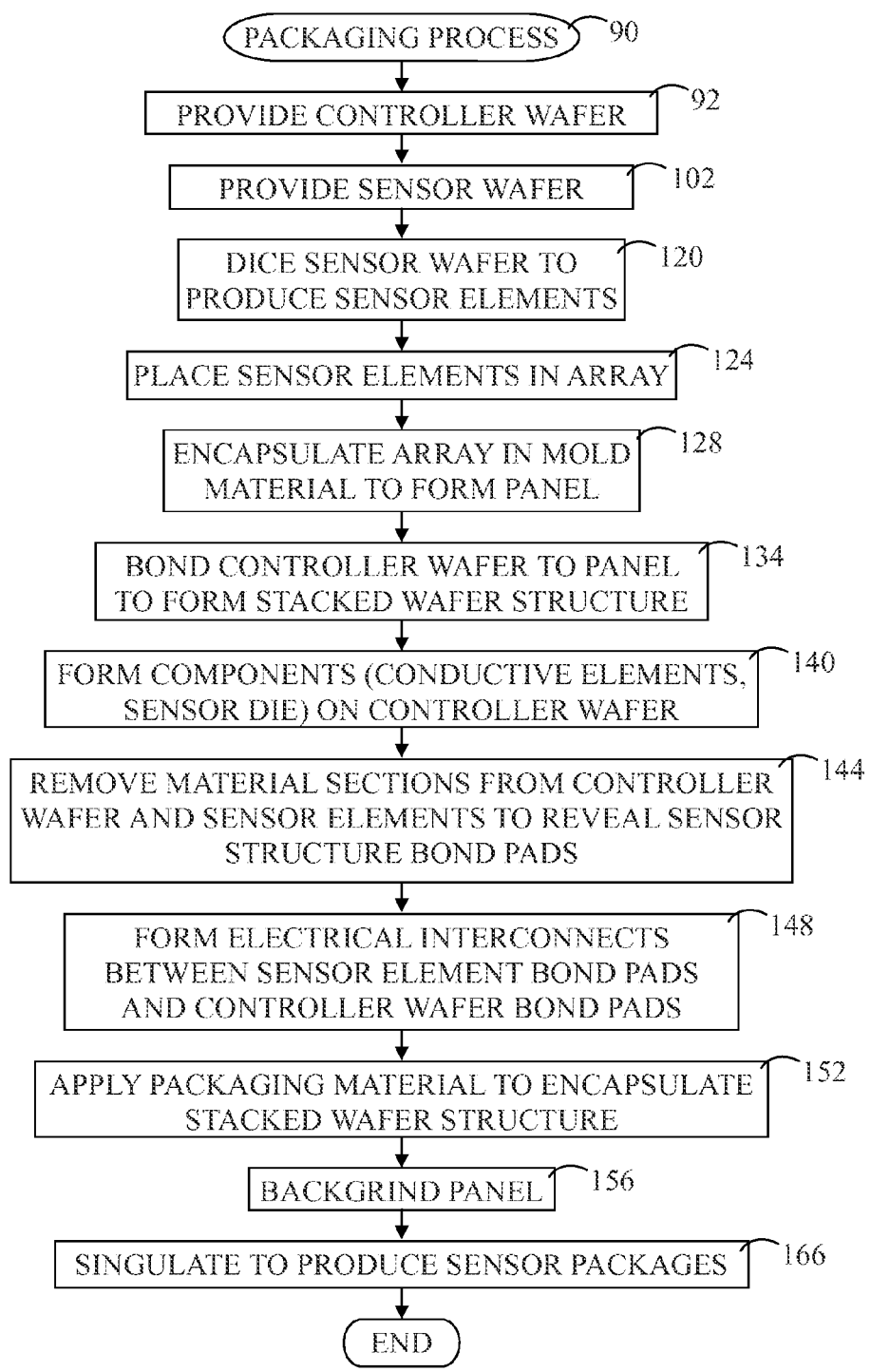
FIG. 4 shows a flowchart of a packaging process for fabricating the sensor packages of FIGS. 1-3.

FIG. 4 shows a flowchart of a packaging process 90 for fabricating sensor packages 20 and 76 (FIGS. 1-3) in accordance with another embodiment. Packaging process 90 sets forth a wafer-level packaging technique in which electronic components are packaged while still in the wafer followed by wafer dicing, in lieu of traditional die placement techniques. Packaging process 90 is especially suited for packaging controller dies (e.g., controller die 24) with sensor structures (e.g., sensor structures 22 and/or 78) in which the sensor structure is smaller than the associated controller die. However, packaging process 90 may be implemented for packaging various types of electronics components.

Packaging process 90 will be discussed in connection with the packaging of a plurality of sensor packages 20 (FIG. 2) and in connection with the packaging of a plurality of sensor packages 76 (FIG. 3). However, it should become apparent that the following methodology can be adapted to packaging methodology for a multiplicity of semiconductor designs. Packaging process 90 sets forth an exemplary flow of operations for clarity of discussion. However, in actual practice there may be variations in the order of operations in accordance with particular processing capabilities of a packaging facility.

Packaging process 90 begins with an activity 92. At activity 92, a controller wafer is provided. The controller wafer may be provided from a device manufacturer and packaged in accordance with packaging process 90 at a separate packaging facility. Alternatively, the controller wafer may be fabricated and packaged within the same manufacturing facility.

Figure 5:
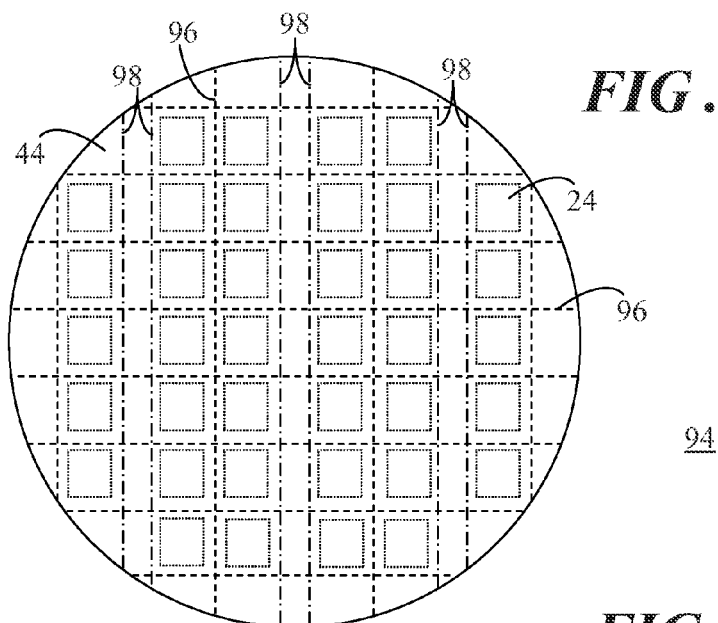
FIG. 5 shows a top view of a controller wafer used in connection with the packaging process.
Figure 6:
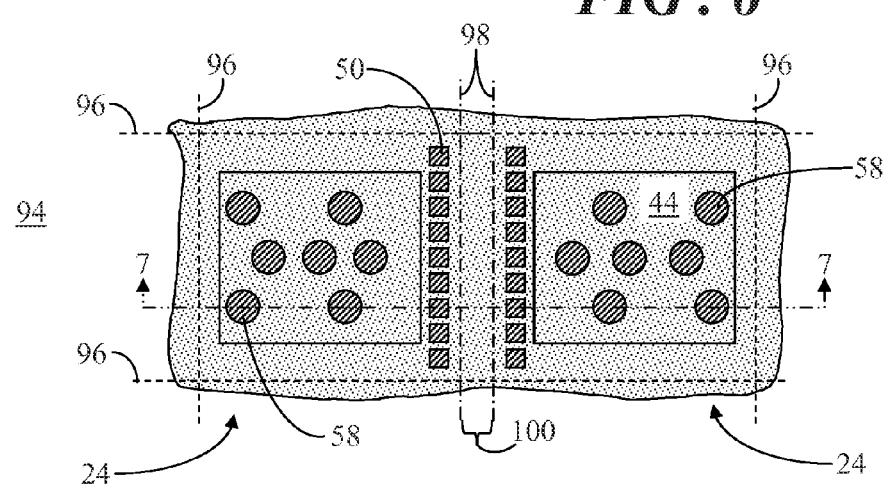
FIG. 6 shows an enlarged partial top view of the controller wafer.
Figure 7:
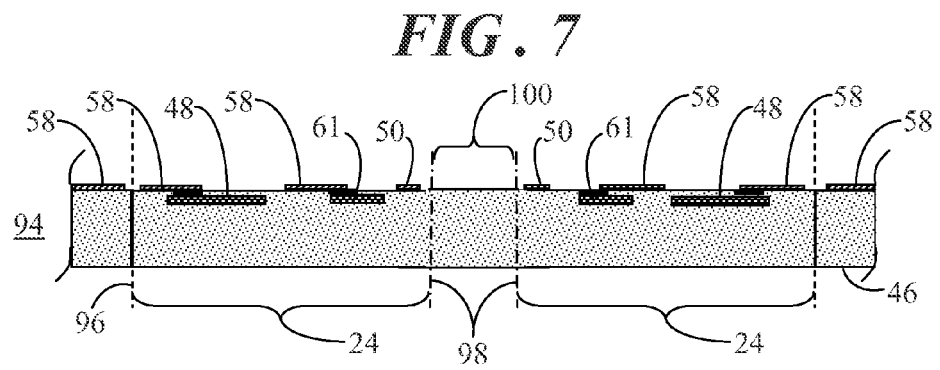
FIG. 7 shows a partial side sectional view of the controller wafer along section lines A-A of FIG. 6.

Referring to FIGS. 5-7 in connection with activity 92, FIG. 5 shows a top view of a controller wafer 94 used in connection with packaging process 90. FIG. 6 shows an enlarged partial top view of controller wafer 94, and FIG. 7 shows a partial side sectional view of controller wafer 94 along section lines 7-7 of FIG. 6. Controller wafer 94 has top side 44 and bottom side 46, in which top side 44 includes a plurality of controller dies 24, and each of controller dies 24 includes control circuitry 48 and, in some embodiments, integral sensor 61.

Controller wafer 94 may be manufactured utilizing conventional and upcoming integrated circuit (IC) fabrication techniques for forming control circuitry 48 in the active regions of controller wafer 94. The implementation of standard IC wafer fabrication techniques creates transistors, capacitors, resistors, diodes, and all other components of control circuitry 48 and, if present, integral sensor 61. In addition, these IC fabrication techniques may be implemented to form bond pads 50 and bumps pads 58 at top side 44 of controller wafer 94. These conventional process steps need not be described herein.

Top side 44 of controller wafer 94 is marked with dashed lines 96 along the generally planar top side 44 of controller wafer 94. Dashed lines 96 represent the locations at which controller wafer 94 will be sawn or diced. Additionally, in the illustrated embodiment, adjacent pairs 98 of vertically arranged dashed lines 96 denoted by a dash-dot sequence represent the locations at which material sections 100 (discussed below) of controller wafer 94 may be removed in order to access an underlying sensor wafer structure (discussed below). These adjacent pairs of lines are collectively referred to herein as saw-to-reveal lines 98. The remaining dashed lines 96 represent the locations at which controller wafer 94 will eventually be singulated (discussed below) concurrent with singulation of the sensor wafer structure. Dashed lines 96 are collectively referred to herein as saw lines 96.

Controller wafer 94 is illustrated as being generally disk-shaped. However, alternative embodiments of controller wafer 94 may be any suitable shape, such as rectangular shaped. Additionally, the quantity of controller dies 24 formed on a given controller wafer 94 varies depending upon the size of controller dies 24 and upon the size of controller wafer 94.

Referring back to FIG. 4, packaging process 90 continues with an activity 102. At activity 102, a sensor wafer structure is provided with a multiplicity of sensors 30 (FIG. 2) formed thereon. The sensor wafer structure may be provided from a device manufacturer and packaged in accordance with packaging process 90 at a separate packaging facility. Alternatively, the sensor wafer structure may be fabricated and packaged within the same manufacturing facility.

Figure 8:
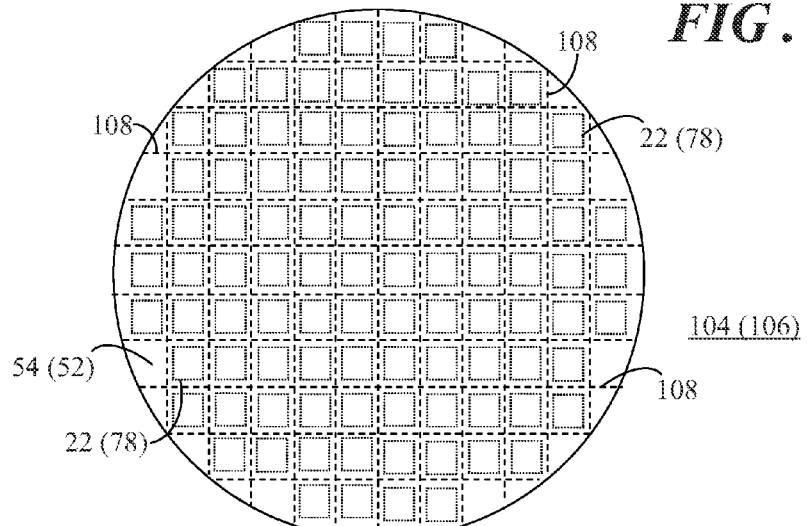
FIG. 8 shows a top view of a sensor wafer structure used in connection with the packaging process.

Referring to FIG. 8 in connection with activity 102, FIG. 8 shows a top view of a sensor wafer structure 104 used in connection with packaging process 90. FIG. 8 particularly illustrates an exemplary sensor wafer structure 104 which includes a plurality of sensor structures 22, represented by dotted lines, used to produce stacked structure 55 (FIG. 2) of sensor package 20 (FIG. 2). Thus, in the top view of sensor wafer structure 104, outer die surface 54 of sensor die 26 (FIG. 2) is visible.

Alternatively, the illustration of FIG. 8 can represent another sensor wafer structure 106. Sensor wafer structure 106 and its associated elements are distinguished by parentheses in FIG. 8. Like sensor wafer structure 104, sensor wafer 106 includes a plurality of sensor structures 78, represented by dotted lines, used to produce stacked structure 80 (FIG. 3) of sensor package 76 (FIG. 3). Thus, in the top view of sensor wafer structure 106, outer cap surface 52 of cap 28 (FIG. 3) is visible.

Sensor structures 22 and 78 may include any of a plurality of sensor devices such as inertial sensors, gyroscopes, optical devices, pressure sensors, magnetic field sensors, switches, microphones, and so forth. However, in alternative embodiments, sensor structures 22 and 78 may include any other device in which it is desirable to individually protect, i.e., cap, sensitive features and additionally expose or reveal terminal elements, i.e., bond pads 42 (FIG. 2) at the wafer level.

Sensor wafer structures 104 and 106 may be manufactured utilizing conventional and upcoming bulk micromachining, surface micromachining, and/or high aspect ratio silicon micromachining techniques. Fabrication processes for a surface micromachining technique can generally include, for example, deposition, patterning, and etching of one or more sacrificial oxide layers, one or more structural polysilicon layers, and the like. For example, one or more sacrificial oxide layers may be deposited overlying the silicon-based wafer, and one or more structural layers may then be deposited over the sacrificial layers.

All elements on either of sensor wafer structures 104 or 106 may be identical, or either of sensor wafer structures 104 or 106 can contain a mixture of sensor elements. Dashed lines 108 represent borders delineating the various sensor structures 22 that make up sensor wafer structure 104, or alternatively, the various sensor structures 78 that make up sensor wafer structure 106. Dashed lines 108 can additionally represent the locations at which sensor wafer structure 104 may eventually be sawn, diced, etched, or otherwise singulated in one or more separate operations (discussed below). Thus, dashed lines 108 are referred to hereinafter as saw lines 108.

Sensor wafer structures 104 and 106 are illustrated as being generally disk-shaped. However, alternative embodiments of sensor wafer structures 104 and 106 may be any suitable shape, such as rectangular shaped. The quantity of sensor structures 22 or 78 that make up a given sensor wafer structure 104 or 106 varies depending upon the size of sensor structures 22 or 78 and upon the size of the wafers (discussed below) used to assemble sensor wafer structure 104 or 106.

Figure 9:
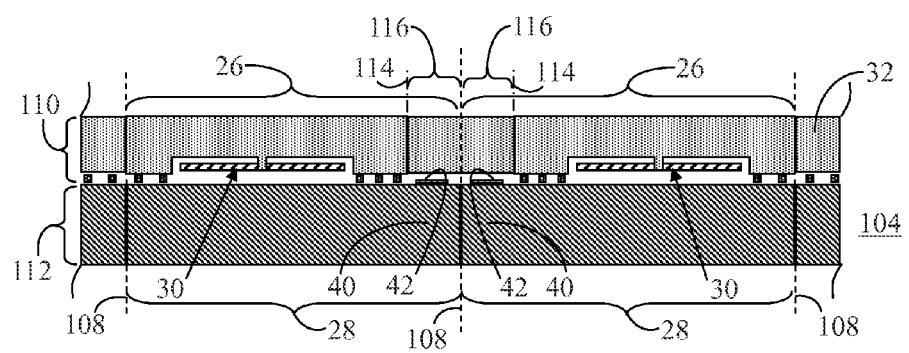
FIG. 9 shows a partial side view of the sensor wafer structure corresponding to the embodiment illustrated in FIG. 2.

Now referring to FIG. 9 in connection with activity 102 (FIG. 4), FIG. 9 shows a partial side view of sensor wafer structure 104 corresponding to the embodiment illustrated in FIG. 2. Sensor wafer structure 104 includes a sensor wafer 110, a cap wafer 112, and a plurality of sensors 30 formed on substrate material 32 of sensor wafer 110. In accordance with conventional and upcoming processes, sensor wafer 110 is fabricated to include sensors 30 and cap wafer 112 is separately fabricated. Cap wafer 112 is subsequently coupled to sensor wafer 110 using any suitable bonding technique and bonding material. Saw lines 108 delineate the boundaries of each adjacent sensor die 26. Likewise, saw lines 108 delineate the boundaries of each adjacent cap 28.

In the illustrated embodiment, select pairs of 114 of lines denoted by a dash-dot sequence represent the locations at which portions (discussed below) of sensor wafer 110 will be removed in order to access bond pads 42 of cap wafer 112. These select pairs 114 are referred to hereinafter as saw-to-reveal lines 114. Therefore, a saw line 108 and an adjacent saw-to-reveal line 114 delineates a material section 116 of each controller die 26 on sensor wafer 110 to be removed in accordance with packaging process 90 (FIG. 4) to expose the underlying bond pads 42 formed on substrate portion 40 of lid 28.

Figure 10:
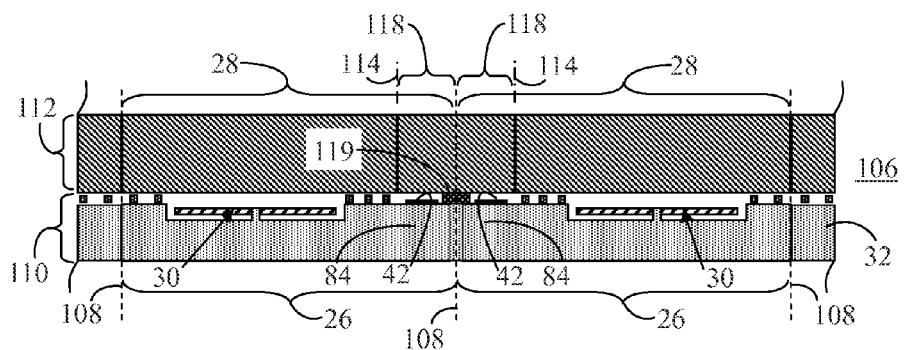
FIG. 10 shows a partial side view of another sensor wafer structure corresponding to the embodiment illustrated in FIG. 3.

Now referring to FIG. 10 in connection with activity 102 (FIG. 4), FIG. 10 shows a partial side view of sensor wafer structure 106 corresponding to the embodiment illustrated in FIG. 3. Sensor wafer structure 106 includes sensor wafer 110, cap wafer 112, and sensors 30 formed on substrate material 32. As described above, sensor wafer 110 is fabricated to include sensors 30 and cap wafer 112 is separately fabricated. Cap wafer 112 is subsequently coupled to sensor wafer 110 using any suitable bonding technique and bonding material. Saw lines 108 delineate the boundaries of each adjacent sensor die 26. Likewise, saw lines 108 delineate the boundaries of each adjacent cap 28. In this configuration, a saw line 108 and an adjacent saw-to-reveal line 114 delineates a material section 118 of each cap 28 of cap wafer 112 to be removed in accordance with packaging process 90 (FIG. 4) to expose the underlying bond pads 42 formed on substrate portion 84 of sensor die 26.

In accordance with an embodiment, sensor wafer structure 106 includes seal members 119, of which only one is visible in FIG. 10, extending between sensor wafer 110 and cap wafer 112. Seal members 119 are positioned between bond pads 42 and saw lines 108. In an embodiment, seal members 119 bridge saw lines 108 between adjacent pairs of bond pads 42. As such, seal members 119 are wider than the dicing width of the equipment used to dice sensor wafer structure 106 along saw lines 108. As will be discussed in connection with FIGS. 23 and 24, the inclusion of seal members 119 shields bond pads 42 from contaminants when sensor wafer structure 106 is diced along saw lines 108. Although sensor wafer structure 106 includes seal members 119, it should be understood that in alternative embodiments, sensor wafer structure 104 (FIG. 9) may include seal members 119. And in still other embodiments, sensor wafer structure 106 may not include seal members 119.

Referring back to FIG. 4, either sensor wafer structure 104 (FIG. 9) or sensor wafer structure 106 (FIG. 10) is provided in response to activity 102. The following activities of packaging process 90 will initially be discussed in connection with the provision of sensor wafer structure 104 to produce sensor packages 20 (FIG. 2) that include sensor structure 22 (FIG. 2).

Following activity 102, packaging process 90 continues with an activity 120. At activity 120, the provided sensor wafer is diced or sawn to produce sensor elements. It should be recalled that surface area 70 (FIG. 1) of sensor structure 22 is less than surface area 68 (FIG. 1) of controller die 24. Beginning with activity 120 and continuing with subsequent activities (discussed below), execution of packaging process 90 cost effectively addresses the problem of a mismatch in surface area 68 of controller die 24 and surface area 70 of sensor structure 22.

Figure 11:
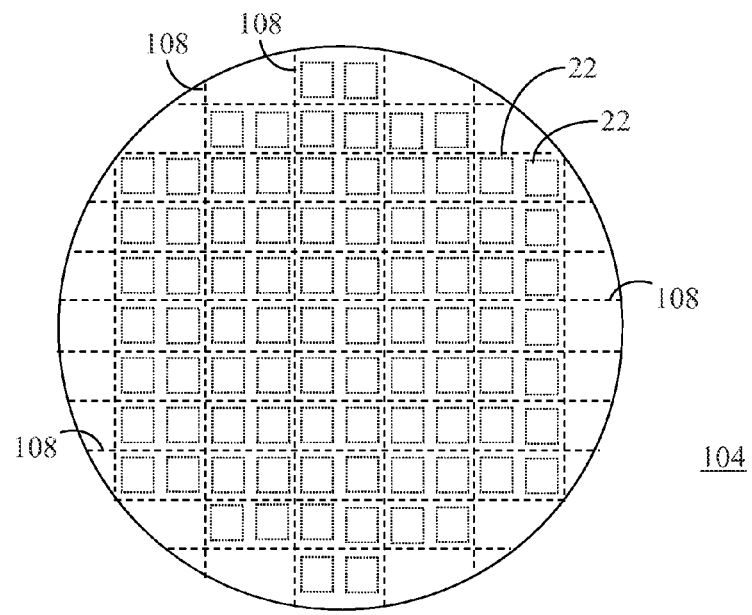
FIG. 11 shows a top view of the sensor wafer structure of FIG. 8 that includes saw lines for dicing the sensor wafer structure in accordance with an embodiment.
Figure 12:
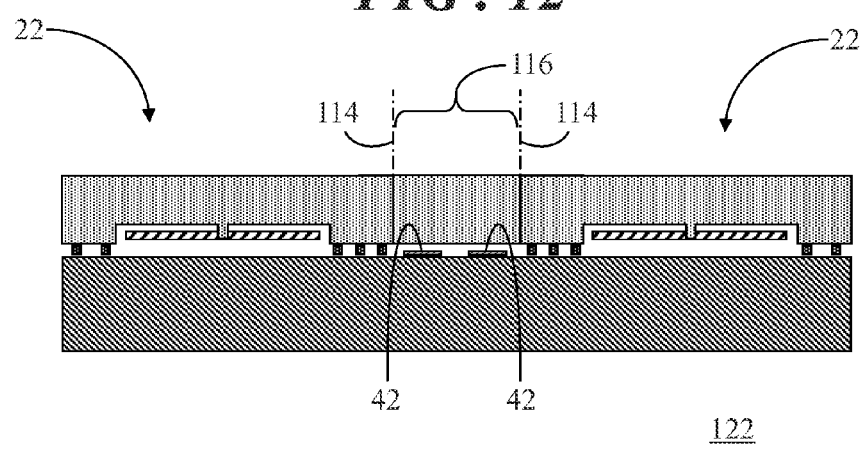
FIG. 12 shows a side view of a sensor element produced following dicing of the sensor wafer structure in accordance with the saw lines presented FIG. 11.

Referring to FIGS. 11 and 12 in connection with activity 120 of packaging process 90, FIG. 11 shows a top view of sensor wafer structure 104 that includes saw lines 108 for dicing the sensor wafer structure 104 in accordance with an embodiment, and FIG. 12 shows a side view of one of sensor elements 122 produced following dicing of sensor wafer structure 104 in accordance with saw lines 108 presented in FIG. 11. In FIG. 11, saw lines 108 are shown between every other vertically aligned column of sensor structures 22. Additionally, saw lines 108 are shown between every horizontally aligned row of sensor structures 22. Saw lines 108 represent fiduciary markers, also referred to as fiducials, for accurately dicing sensor wafer structure 104.

Sensor wafer structure 104 is diced, sawn, laser cut, or otherwise separated along saw lines 108 so that each sensor element 122 includes two sensor structures 22 whose corresponding bond pads 42 are arranged adjacent to one another. Note in FIG. 12 that material section 116 between saw-to-reveal lines 114 of sensor element 122 remains present and conceals bond pads 42 in order to protect bond pads 42 from contaminants during dicing of sensor wafer structure 104 along saw lines 108, and to protect bond pads 42 during some ensuing operations.

Returning back to FIG. 4, packaging process 90 continues with an activity 124 following activity 120. At activity 124, sensor elements 122 (FIG. 12) are placed in an array, i.e., an arrangement of sensor elements 122, to correspond with locations of controller dies 24 (FIG. 5) in controller wafer 94 (FIG. 5).

Figure 13:
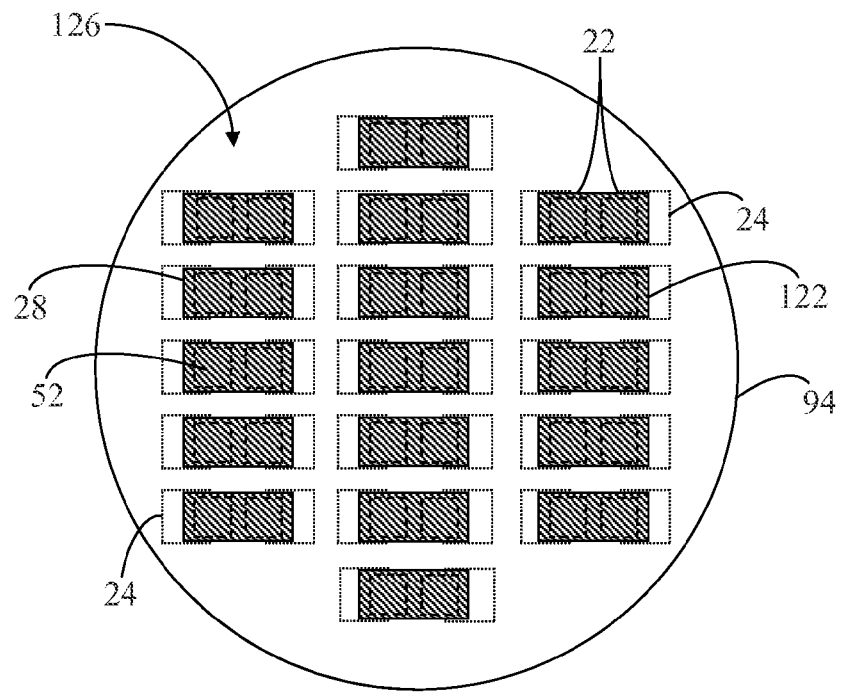
FIG. 13 shows a top view of an array of the sensor elements of FIG. 12 used in connection with the packaging process.

With reference to FIG. 13 in connection with activity 124, FIG. 13 shows a top view of an array 126 of sensor elements 122 used in connection with the packaging process 90. For illustrative purposes, controller dies 24 of controller wafer 94 are shown in dotted line form underlying sensor elements 122 in order to correlate the position of sensor elements 122 in array 126 with the locations of controller dies 24 of controller wafer 94. Sensor elements 122 are thus distributed in array 126 to align with controller dies 24. Sensor elements 122 may be picked and placed in the wafer format of array 126 on pitches which correspond to the pitch of the of controller dies 24 on controller wafer 94. Prior to forming sensor elements 122, sensor wafer structure 104 may include fiduciary markers, also referred to as fiducials, so that sensor elements 122 are placed in array 126 with excellent rotational accuracy.

Array 126 includes three columns of sensor elements 122 in this exemplary configuration. However, any quantity of sensor elements 122 may be present in array 126 in accordance with the quantity of controller dies 24 in controller wafer 94. In this illustration, sensor elements 122 are oriented with caps 28 facing upwardly so that adjacent outer cap surfaces 52 are visible. However, in alternative arrangements, caps 28 may be oriented downwardly so that outer die surfaces 54 (FIG. 2) of sensor dies 26 would be visible.

With reference back to FIG. 4, following activity 124, packaging process 90 continues with an activity 128. At activity 128, array 126 is encapsulated in a mold material to form a panel of sensor elements 122.

Figure 14:
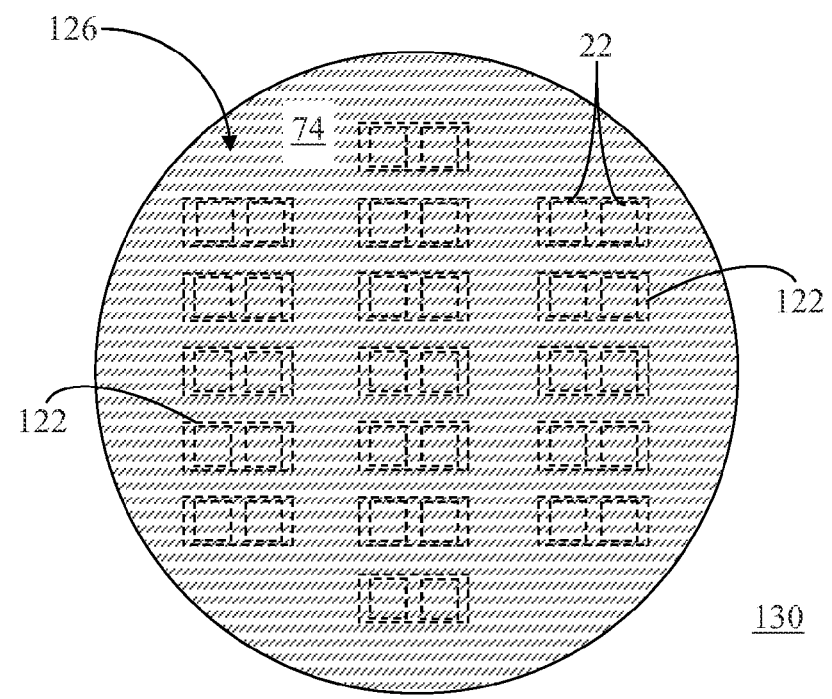
FIG. 14 shows a top view of a panel of the sensor elements of FIG. 12 produced in accordance with the packaging process.
Figure 15:
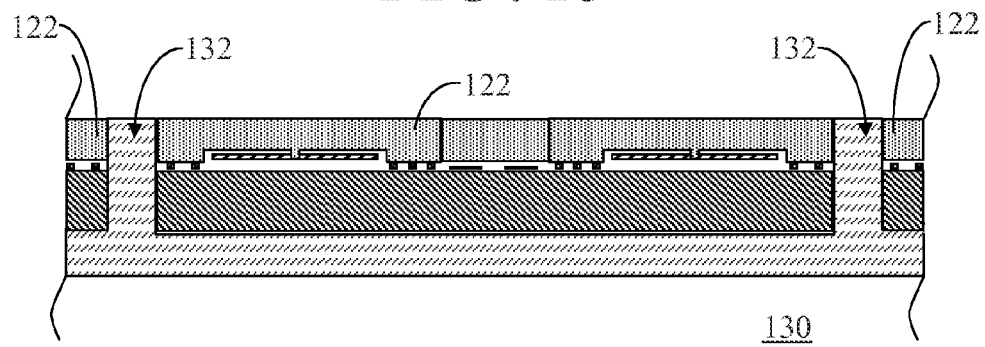
FIG. 15 shows a partial side sectional view of the panel of FIG. 14.

Referring to FIGS. 14 and 15 in connection with activity 128, FIG. 14 shows a top view of a panel 130 of sensor elements 122 produced in accordance with packaging process 90 and FIG. 15 shows a partial side sectional view of panel 130. In accordance with activity 128, mold material 74 is deposited over sensor elements 122 (shown in dashed line form) of array 126 to form a new sensor "wafer", i.e., panel 130, whose size and arrangement of sensor structures 22 matches controller dies 24 (FIG. 5) of controller wafer 94 (FIG. 5). Mold material 74 fills voids 132 between laterally spaced apart sensor elements 122 within array 126. Thus, panel 130 is a composite wafer structure that includes multiple sensor elements 122 of sensor structures encapsulated by mold material 74. The placement and encapsulation activities 124 and 128 of packaging process 90 yield excellent accuracy for the rotation angles of sensor dies 26 (FIG. 2) in sensor structures 22 in array 126.

Returning back to packaging process 90 (FIG. 4), following activity 128 processing continues with an activity 134. At activity 134, controller wafer 94 (FIG. 5) is bonded to panel 130 (FIG. 14) to form a stacked wafer structure.

Figure 16:
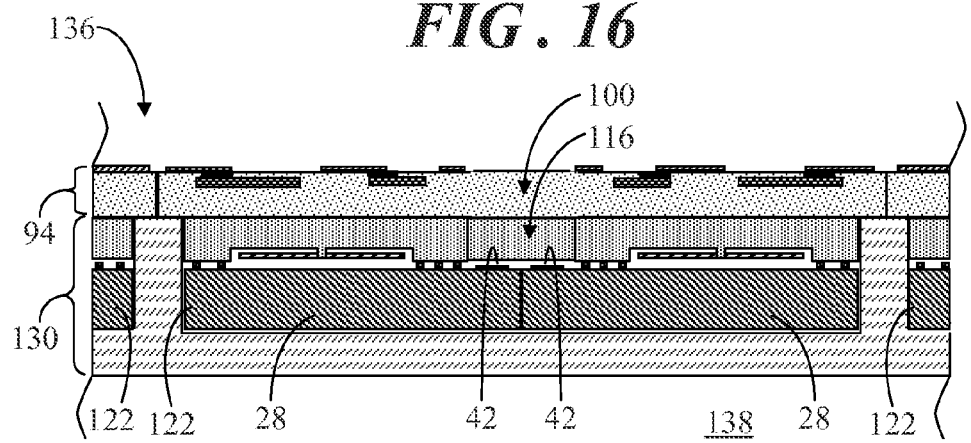
FIG. 16 shows a partial side sectional view of the controller wafer bonded to the panel of FIG. 15 to form a stacked wafer structure at an intermediate stage of packaging in accordance with the packaging process.

With reference to FIG. 16 in connection with activity 134, FIG. 16 shows a partial side sectional view of controller wafer 94 bonded to panel 130 to form a stacked wafer structure 136 at an intermediate stage 138 of packaging. Bonding may be performed utilizing direct bonding, adhesive bonding, thermocompression bonding, reactive bonding, plasma activated bonding, anodic bonding, eutectic bonding, or any other suitable bonding technique. For example, an epoxy die attach material or film may be utilized to bond controller wafer 94 to panel 130. As shown in FIG. 16, material section 100 of controller wafer 94 and material section 116 of sensor elements 122 conceals the underlying bond pads 42 formed on caps 28.

Alignment of controller wafer 94 with sensor elements 122 of panel 130 may be achieved by utilizing mechanical or optical fiduciary marks, such as notches at the edges of controller wafer 94 and panel 130, pins, etchings, or holographic images, among others. Automatic process equipment for silicon wafer bonding, as well as the integration of suitable alignment techniques, can provide precision location keyed to specific features on the semiconductor elements within panel 130 and controller wafer 94. Thus, angular alignment of less than one tenth of a degree of accuracy for the sensors may be achieved. This alignment accuracy is in contrast with the angular alignment of sensors achieved in traditional chip level die packaging, which is typically limited to approximately plus or minus two degrees of accuracy.

Referring back to FIG. 4, packaging process 90 continues with an activity 140 following bonding activity 134. At activity 140, components may be formed on or attached to controller wafer 94. These components can include, for example, conductive elements 60 (FIG. 2) on bump pads 58 (FIG. 2) of controller wafer 94 (FIG. 5) and sensor die 62 (FIG. 2), when the design configuration of sensor package 20 (FIG. 2) calls for sensor die 62.

Figure 17:
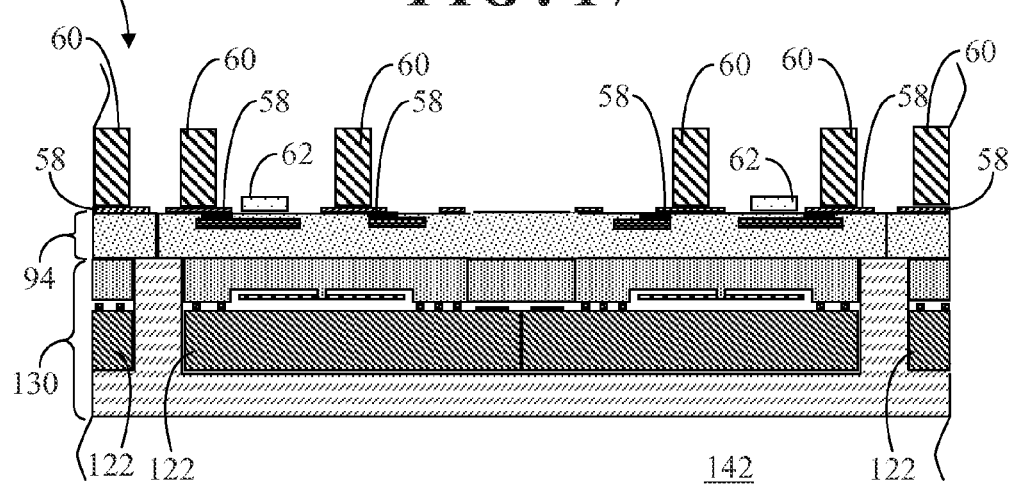
FIG. 17 shows a partial side sectional view of the stacked wafer structure of FIG. 16 at a subsequent stage of packaging.

Referring now to FIG. 17 in connection with activity 140, FIG. 17 shows a partial side sectional view of stacked wafer structure 136 of FIG. 16 at a subsequent stage 142 of packaging. As shown in FIG. 17, conductive elements 60 are formed on bump pads 58 of controller wafer 94. Conductive elements 60 may be copper pillars that are plated onto bump pads 58 of controller wafer 94. Alternatively, stud bumps or solder balls may be attached to bump pads 58 in accordance with conventional processes.

Conductive elements 60 are formed on bump pads 58 of the bonded wafers of stacked wafer structure 136 as a wafer-level process to achieve improvements in rotational accuracy of sensor package 20 (FIG. 2) to the product circuit. Formation of conductive elements 60 as a wafer-level process achieves accuracy improvements as compared with assembling a die into a sensor package, followed by assembling the sensor package into a product circuit. Accordingly, when sensor package 20 is eventually assembled to a product circuit by, for example, soldering, the location and rotation of sensor package 20 relative to the product circuit will be determined by the location and rotation of conductive elements 60 because the solder will align conductive elements 60 to the corresponding features on the product circuit. As mentioned above, there may be variations in the order of operations in accordance with particular processing capabilities of a packaging facility. For example, conductive elements 60 may be formed at different stages of packaging process 90, for example, after wirebonding or after encapsulation, but prior to a singulation activity (discussed below).

As further shown in FIG. 17, sensor dies 62 may be bonded to controller wafer 94 by a die attach process and wire bonded to controller wafer 94. Alternatively, sensor dies 62 may be mounted to controller wafer 94 utilizing a flip chip technique in which sensor dies 62 are inverted and connected directly to controller wafer 24 using, for example, solder bump mounting, stud bump bonding, and the like, rather than a conventional wire bonding technique. The mounting of sensor dies 62 onto controller wafer 102 can achieve improved package density.

With reference back to FIG. 4, following activity 140, packaging process 90 continues with an activity 144. At activity 144, material sections 100 (see FIG. 16) of controller wafer 94 and material sections 116 (see FIG. 16) of each of sensor elements 122 (FIG. 12) coincident, i.e., in stacked arrangement, with material sections 100 are removed to reveal bond pads 42 (FIG. 2) on cap wafer 112 (FIG. 9).

Figure 18:
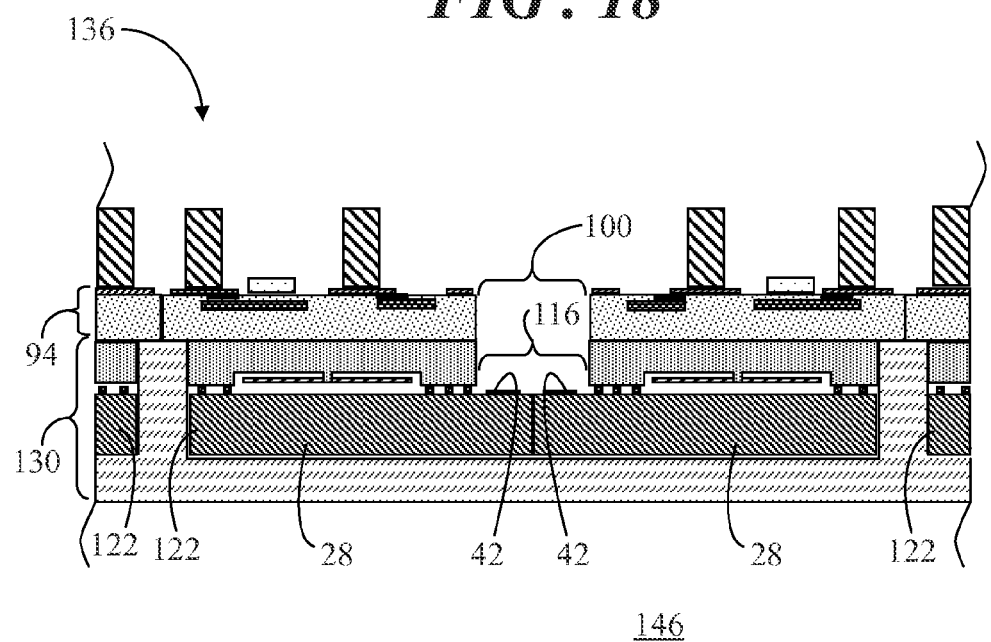
FIG. 18 shows a partial side sectional view of the stacked wafer structure of FIG. 17 at a subsequent stage of packaging.

Referring to FIG. 18 in connection with activity 144, FIG. 18 shows a partial side sectional view of stacked wafer structure 136 at a subsequent stage 146 of packaging. As shown in FIG. 18, material sections 100 of controller wafer 94 and material sections 116 of sensor elements 122 have been removed to expose, i.e., reveal, bond pads 42, of the underlying caps 28. Material sections 100 and 116 may be removed by sawing along saw-to-reveal lines 98 (see FIG. 6) in controller wafer 194 and saw-to-reveal lines 114 (see FIG. 12) in sensor elements 122 within panel 130.

Again referring back to FIG. 4, once material sections 100 and 116 have been removed to expose, i.e., reveal, bond pads 42 at activity 144, packaging process 90 continues with an activity 148. At activity 148, electrical interconnects in the form of bond wires 56 (FIG. 2) are attached between bond pads 42 of caps 28 and bond pads 50 (FIG. 2) of controller wafer 94.

Figure 19:
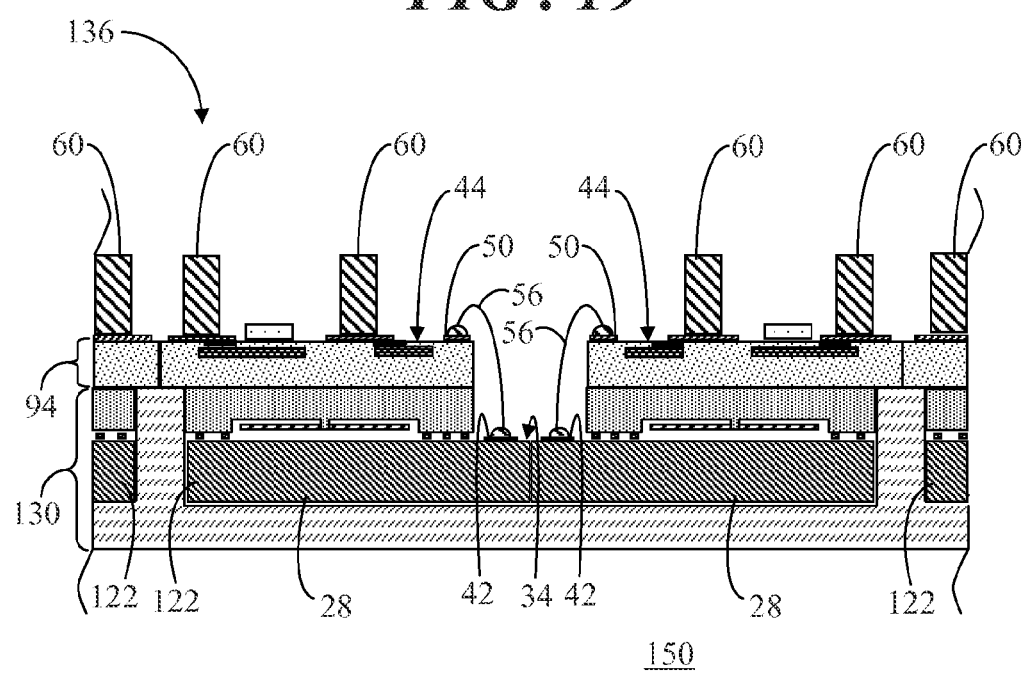
FIG. 19 shows a partial side sectional view of the stacked wafer structure of FIG. 18 at a subsequent stage of packaging.

Referring now to FIG. 19 in connection with activity 148, FIG. 19 shows a partial side sectional view of stacked wafer structure 136 at a subsequent stage 150 of packaging. As shown, bond wires 56 are bonded to bond pads 42 on inner cap surface 34 of caps 28 and to corresponding bond pads 50 on top side 44 of controller wafer 94 using a conventional wire bonding process. It should be observed that conductive elements 60 are higher than the wire bond loop height of bond wires 56. Wire bonding is a cost-effective and flexible interconnect technique, and can be readily implemented when forming electrical interconnects during a wafer-level fabrication process.

Referring back to FIG. 4, following wire bonding activity 148, packaging process 90 continues with an activity 152. At activity 152, packaging material 64 (FIG. 2) is applied to encapsulate stacked wafer structure 136.

With reference to FIG. 20 in connection with activity 152, FIG. 20 shows a partial side sectional view of stacked wafer structure 136 at a subsequent stage 154 of packaging. As shown in FIG. 20, conductive elements 60, top side 44 of controller wafer 94, sensor die 62, bond wires 56, and exposed inner cap surface 34 of caps 28 are encapsulated with packaging material 64. Packaging material 64 may be mold compound, potting compound, epoxy resin, and so forth. Packaging material 64 is applied in a thick enough layer to cover bond wires 56 and conductive elements 60. However, if packaging material 64 entirely covers conductive elements 60 during encapsulation, packaging material 64 may be ground down or otherwise abraded to expose top surface 66 of conductive elements 60 without exposing bond wires 56.

Referring back to FIG. 4, following activity 152, packaging process 90 continues with a task 156. At task 156, panel 130 undergoes a backgrinding process using a conventional abrasive material and equipment to thin panel 130.

With reference now to FIG. 21, FIG. 21 shows a partial side sectional view of stacked wafer structure 136 of FIG. 20 at a subsequent stage 158 of packaging. As represented in FIG. 21 by a dotted line, panel 130 may exhibit an initial thickness 160 following encapsulation activity 128 (FIG. 4). Wafer backgrinding is a semiconductor device fabrication operation in which wafer thickness is reduced to enable stacking and high density packaging of semiconductor devices. Wafer backgrinding removes excess mold material 74 from outer cap sides 52 of caps 28 so that a final thickness 162 of panel 130 following execution of backgrinding activity 156 is less than initial thickness 160. Final thickness 162 can be any suitable dimension that is as thin as possible without unduly sacrificing mechanical stability of panel 130 and/or damaging sensor elements 122. Note that for illustrative purposes, stacked wafer structure 136 is shown with saw lines 164 indicating where stacked wafer structure 136 will eventually be diced to produce sensor packages 20 (FIG. 2).

Again referring back to FIG. 4, following any of wire bonding activity 148, encapsulation activity 152, and/or backgrinding activity 156, continued processing may be performed which is not shown herein for brevity. This continued processing may entail the addition of solder balls above conductive elements 60. The added solder balls can increase standoff and improve the electrical interconnection Additional continued processing may entail visual inspection, operational testing, burn-in, stress testing, accelerated life testing, the build-up of additional redistribution layers above packaging material 64 and top surface 66 of conductive elements 60, and so forth all while still at wafer level.

Following activity 156, an activity 166 is eventually performed. At activity 166, the fabricated stacked wafer structure 136 is singulated, i.e., cut, punched, or diced, in a conventional manner. Following activity 166, packaging process 90 ends.

Referring to FIG. 22 in connection with activity 166, FIG. 22 shows a side sectional view of sensor packages 20 produced from stacked wafer structure 136 (FIG. 21) in accordance with packaging process 90. As shown, stacked wafer structure 136 has been singulated, i.e., cut, punched, or diced, along saw lines 164 (FIG. 21). Following singulating activity 166, the individual sensor packages 20 can be coupled onto, for example, a printed circuit board in an end application. Each of the resulting sensor packages 20 represents a chip-scale package in which the x and y package dimensions of each sensor package 20 are approximately equivalent to the x and y dimensions of each controller die 24, with the x and y dimensions of sensor structure 22 being smaller than those of controller die 24. However, sensor structure 22 is enlarged into composite sensor structure 72 by encapsulation of sensor structure 22 so that wafer level packaging can take place.

Packaging process 90 was described above as a wafer-to-wafer packaging process utilizing sensor wafer structure 104 (FIG. 8) to produce a "new" wafer, namely panel 130 of sensor elements 122, each of elements 122 containing two sensor structures 22 with their sensor die 26. Controller wafer 94 (FIG. 5) and panel 130 (FIG. 14) are subsequently packaged to yield sensor packages 20, in which the sensor structure 22 is smaller in surface area (x and y dimensions) than the surface area (x and y dimensions) of controller die 24. The two sensor structure 22 configuration of sensor elements 122 leaves bond pads 42 (FIG. 2) protected while creating panel 130. However, this technique may double the sensor package 20 yield loss since the doublet containing two sensor structures 22 will be discarded if either one of the two sensor structures 22 is defective. Additionally, this technique may double the controller die 24 yield loss by the sensor structure 22 yield loss.

In accordance with an alternative embodiment, packaging processes 90 is described below utilizing sensor wafer structure 106 (FIG. 8) to produce a "new" wafer, i.e., a panel (discussed below), that includes sensor elements in the form of individual sensor structures 78 (FIG. 3). This panel of individual sensor structures 78 and controller wafer 94 can be utilized to produce sensor package 76 (FIG. 3). It should be readily understood, however, that packaging process 90 may be implemented utilizing sensor wafer structure 104 (FIG. 7) to produce a panel that includes sensor elements in the form of individual sensor structures 22 (FIG. 3). Likewise, packaging process 90 may be implemented utilizing sensor wafer structure 106 to produce a panel that includes sensor elements containing two sensor structures 78 to produce sensor package 76. In each embodiment, improvements may be achieved in rotation and tilt accuracy relative to traditional chip level die packaging.

Figure 23:
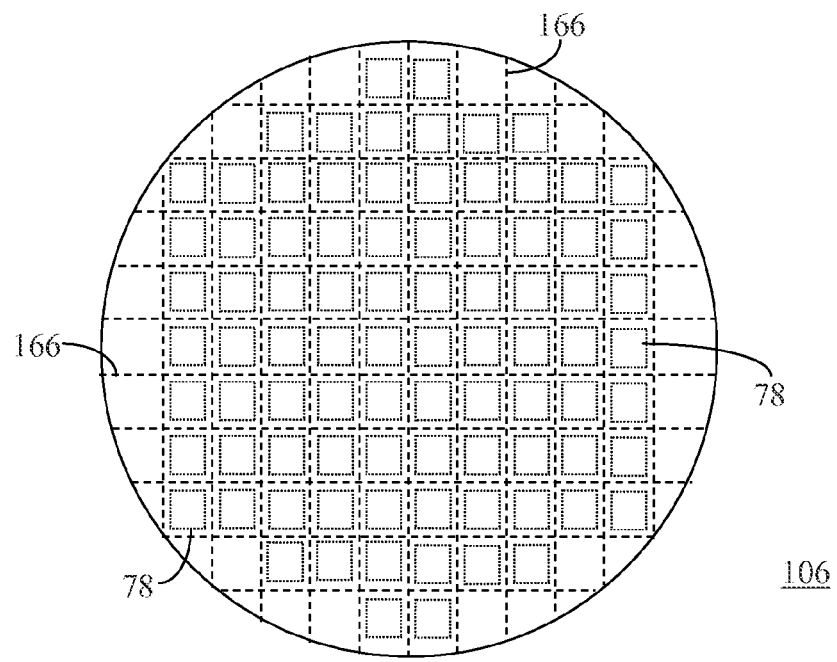
FIG. 23 shows a top view of the sensor wafer structure of FIG. 8 that includes saw lines for dicing the sensor wafer structure in accordance with another embodiment.
Figure 24:
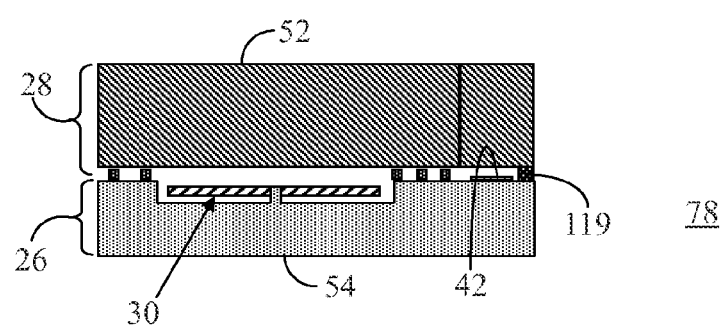
FIG. 24 shows a side view of sensor elements produced following dicing of the sensor wafer structure in accordance with the saw lines of FIG. 23.

Referring to FIGS. 23 and 24, FIG. 23 shows a top view of sensor wafer structure 106 that includes saw lines 166 for dicing sensor wafer structure 106 in accordance with another embodiment. FIG. 24 shows a side view of sensor elements produced following dicing of sensor wafer structure 106 in accordance with saw lines 166 of FIG. 23. In response to the execution of dicing activity 120 (FIG. 4) of packaging process 90, sensor elements in the form of singulated sensor structures 78, each of which includes one of sensor dies 26, is produced. The singulated sensor structures 78 will be implemented as sensor elements to form a "new" wafer, i.e., a panel (discussed below).

As mentioned previously, sensor wafer structure 106 includes seal members 119. Seal members 119 are advantageous in configurations in which singulated sensor structures 78 are to be utilized to form a new panel. Since seal members 119 bridge saw lines 108 (i.e., are wider than the width of the cut), a portion of each of seal members 119 remains in place extending between sensor wafer 110 (FIG. 10) and cap wafer 112 (FIG. 10) as sensor wafer structure 106 is diced. This remaining portion of seal members 119 largely shields bond pads 42 from contaminants during dicing activity 120 (FIG. 4) of packaging process 90 (FIG. 4).

Inclusion of seal members 119 may result in sensor wafer structure 106 being larger than a sensor wafer structure that does not have seal members 119 (e.g., sensor wafer structure 104 of FIG. 9). Nevertheless, seal members 119 can provide sufficient shielding of bond pads 42 during dicing and encapsulation for configurations in which sensor structures 78 are to be singulated prior to forming a new panel.

Figure 25:
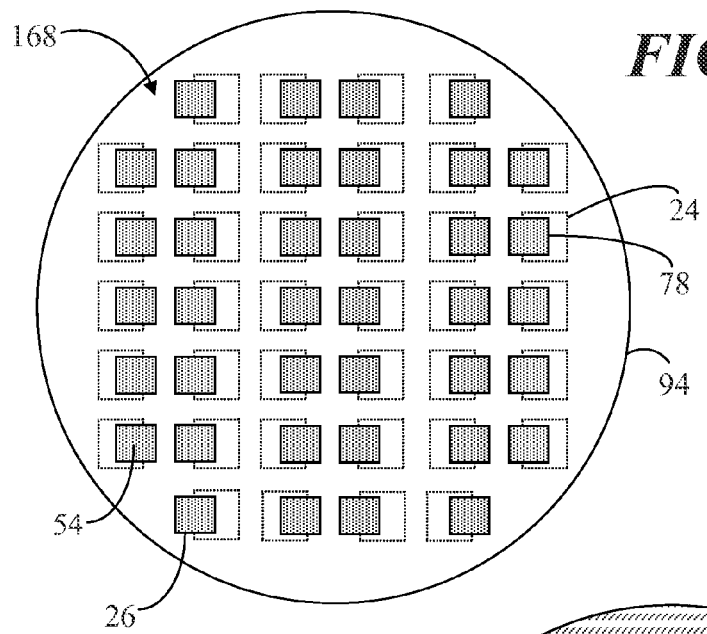
FIG. 25 shows a top view of an array of the sensor elements of FIG. 24 used in connection with the packaging process.

FIG. 25 shows a top view of an array 168 of the sensor elements of FIG. 24, i.e., sensor structures 78, used in connection with packaging process 90 (FIG. 4). In particular, sensor structures 78 are placed in array 168 when activity 124 (FIG. 4) of packaging process 90 (FIG. 4) is performed. For illustrative purposes, controller dies 24 of controller wafer 94 are shown in dotted line form underlying sensor structures 78 in order to correlate the position of sensor structures 78 in array 168 with the locations of controller dies 24 of controller wafer 94. Sensor structures 78 are thus distributed in array 168 to align with controller dies 24.

Array 168 includes six columns of sensor structures 78 in this exemplary configuration. However, any quantity of sensor structures 78 may be present in array 168 in accordance with the quantity of controller dies 24 in controller wafer 94 and the size of controller wafer 94. In this illustration, sensor structures 78 are oriented with sensor dies 26 facing upwardly so that outer die surfaces 54 are visible. However, in alternative arrangements, sensor dies 26 may be oriented downwardly so that outer cap surfaces 52 (see FIG. 24) of caps 28 would be visible.

Figure 26:
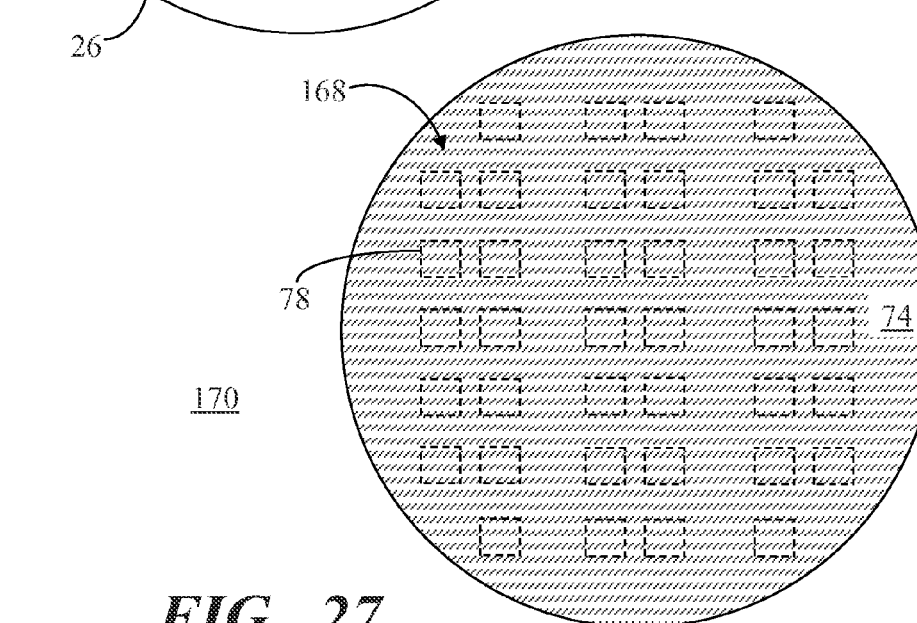
FIG. 26 shows a top view of a panel of the sensor elements of FIG. 24 produced in accordance with the packaging process.
Figure 27:
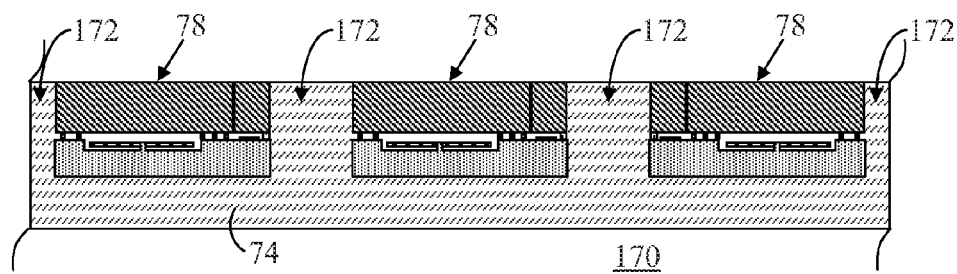
FIG. 27 shows a partial side sectional view of the panel of FIG. 26.

Referring to FIGS. 26 and 27, FIG. 26 shows a top view of a panel 170 of the sensor elements of FIG. 24, i.e., sensor structures 78, produced in accordance with packaging process 90 (FIG. 4), and FIG. 27 shows a partial side sectional view of panel 170. In particular, panel 170 is formed when activity 128 (FIG. 4) of packaging process 90 (FIG. 4) is performed. In accordance with activity 128, mold material 74 is deposited over sensor structures 78 (shown in dashed line form) of array 168 to form a new sensor "wafer", i.e., panel 170, whose size and arrangement of sensor structures 78 matches controller dies 24 (FIG. 5) of controller wafer 94 (FIG. 5). Mold material 74 fills voids 172 between laterally spaced apart sensor structures 78 within array 168. Thus, panel 170 is a composite wafer structure that includes multiple sensor structures 78 encapsulated by mold material 74. Following formation of panel 170, the subsequent activities of packaging process 90, such as wafer bonding, forming components on controller wafer 94, exposing bond pads 42, wirebonding, encapsulation, singulation, and so forth can proceed.

By implementing a technique in which singulated sensor structures 78 are used to form a panel commensurate in size with the controller wafer, greater disparities in die sizes between the sensor dies and the controller dies and bond pad locations may be accommodated. Sensor dies 26 may be probed and tested while still in wafer form, i.e., while still configured as sensor wafer 110 (FIG. 10), prior to attachment of cap wafer 112 (FIG. 10) so that any "bad" (i.e., inappropriately functioning) sensor dies 26 may be discarded when sensor structures 78 are singulated. Consequently, since only single sensor structures 78 are paired with single controller dies 24, only the "good" (i.e., appropriately functioning) sensor dies 26 within sensor structures 78 will be bonded with controller dies 24, thereby reducing yield loss as compared with the pairs of sensor dies 26 in each of sensor elements 122 (FIG. 12).

Embodiments described herein entail sensor packaging methodology and electronic component packages produced in accordance with the packaging methodology. The packaging methodology involves a wafer-level packaging technique in lieu of traditional die placement techniques. In accordance with the wafer-level packaging technique, a sensor wafer structure is diced into sensor elements, without exposing bond pads to contamination. The sensor elements are picked and placed in an array and encapsulated to form a panel. A controller wafer is subsequently bonded to this panel to form a stacked wafer structure with the active side of the controller wafer facing outwardly from the package. Thus, the package inputs and outputs can be formed on the controller wafer. A portion of the stacked wafer structure is sawn, etched, or otherwise cut to reveal the underlying bond pads of the sensor wafer structure and the corresponding bond pads for the controller dies on the controller wafer are wire bonded to the sensor bond pads in wafer format. The methodology is particularly useful when the sensor structures containing sensor dies are smaller than the controller dies within the stacked configuration.

The wafer-level packaging process is especially suitable for the packaging of miniaturized sensors where precise rotation and tilt accuracy of the sensors can be achieved at the wafer level, rather than at the die level. Moreover, the required angular accuracy can be assured without more costly and time consuming testing. Accordingly, the wafer-level packaging process discussed herein provides high-throughput and precise placement packaging of sensors at relatively low cost. Moreover, the wafer-level packaging process results in individual sensor packages that are generally the same size as the larger controller die, stacking of sensors and microelectronic devices for size reduction and improved package density, enhanced electrical performance, and so forth. Additionally, the wafer structure and corresponding methodology are cost-effective, readily implemented, and adaptable to existing assembly and packaging tools and techniques.

Although the preferred embodiments of the invention have been illustrated and described in detail, it will be readily apparent to those skilled in the art that various modifications may be made therein without departing from the spirit of the invention or from the scope of the appended claims. For example, the process operations following wafer bonding can be performed in a differing order then that which was presented.

What is claimed is:

1. A method of forming electronic component packages comprising:
    placing a plurality of first electronic components in an array arranged to correspond with locations of second electronic components formed on a wafer, each of said first electronic components including first bond pads, and each of said second electronic components including second bond pads;
    encapsulating said array in a mold material to form a panel of said first electronic components, wherein said first bond pads are concealed by at least one of said wafer and a portion of said panel;
    bonding a bottom side of said wafer to an outer surface of said panel to form a stacked wafer structure of said first and second electronic components;
    following said bonding operation, removing a material section from said at least one of said wafer and said portion of said panel of said first electronic components to expose said first bond pads;
    forming electrical interconnects between said first and second bond pads; and
    dicing said stacked wafer structure to produce said electronic component packages.

2. A method as claimed in claim 1 wherein said wafer is a first wafer, and said method comprises dicing a second wafer, said second wafer including a plurality of said first electronic components, said dicing operation producing said first electronic components for placement in said array.

3. A method as claimed in claim 2 wherein:
    said second wafer comprises a sensor wafer structure that includes a sensor wafer and a cap wafer, wherein each of said first electronic components includes a sensor die having a sensor located on said sensor wafer, a first inner surface of said cap wafer is coupled to a second inner surface of said sensor wafer, a first one of said cap wafer and said sensor wafer includes a substrate portion with said first bond pads being located on a corresponding one of said first and second inner surfaces, and a second one of said cap wafer and said sensor wafer conceals said substrate portion; and
    said dicing said second wafer includes dicing said sensor wafer structure to produce singulated ones of said sensor dies for placement in said array.

4. A method as claimed in claim 3 wherein sensor wafer structure further includes seal members extending between said sensor wafer and said cap wafer, at least a portion of said seal members being positioned between said first bond pads and saw lines of said sensor wafer structure, said seal members shielding said first bond pads from contaminants when said sensor wafer structure is diced along said saw lines.

5. A method as claimed in claim 1 wherein a second surface area of each of said second electronic components is greater than a first surface area of each of said first electronic components, and said placing operation comprises distributing said first electronic components in said array to align said first electronic components with said second electronic components.

6. A method as claimed in claim 1 wherein said wafer includes bump pads formed on a top side, and said method further comprises forming conductive elements on said bump pads prior to said dicing operation.

7. A method as claimed in claim 1 wherein:
    a second wafer comprises a sensor wafer structure that includes a sensor wafer and a cap wafer, wherein each of said first electronic components includes a sensor die having a sensor located on said sensor wafer, a first inner surface of said cap wafer is coupled to a second inner surface of said sensor wafer, a first one of said cap wafer and said sensor wafer includes a substrate portion having said first bond pads formed on a corresponding one of said first and second inner surfaces, and a second one of said cap wafer and said sensor wafer conceals said substrate portion; and said removing operation comprises removing first material from said wafer of said stacked wafer structure and removing second material coincident with said first material from said second one of said sensor wafer and said cap wafer to expose said substrate portion having said first bond pads.

8. A method as claimed in claim 1 wherein said electrical interconnects are formed before said dicing operation.

9. A method as claimed in claim 1 further comprising:
applying a packaging material over said top side of said wafer to encapsulate said second electronic components and said electrical interconnects; and
performing said dicing operation following said applying operation.

10. A method as claimed in claim 1 wherein said panel exhibits a first thickness that is greater than a second thickness of said first electronic components, and said method further comprises:
thinning a back side of said panel to reduce said first thickness to approximately said second thickness; and
performing said dicing operation following said thinning operation.

11. A method of forming electronic component packages comprising:
placing a plurality of first electronic components in an array arranged to correspond with locations of second electronic components formed on a first wafer;
encapsulating said array in a mold material to form a panel of said first electronic components;
bonding a bottom side of said wafer to an outer surface of said panel to form a stacked wafer structure of said first and second electronic components; and
dicing said stacked wafer structure to produce said electronic component packages, wherein said method further comprises:
dicing a second wafer, said second wafer including a plurality of said first electronic components, and wherein said second wafer comprises a wafer structure that includes said first electronic components arranged in pairs in said wafer structure, each of said first electronic components having first bond pads, wherein said first bond pads of a first one of said first electronic components are adjacent to said first bond pads of a second one of said second electronic components in each of said pairs of said first electronic components, and said dicing said second wafer comprises producing said first electronic components in the form of said pairs of said first electronic components for placement in said array.

12. A method of forming sensor packages comprising:
dicing a sensor wafer to produce sensor elements, said sensor wafer including a plurality of sensor dies, each of said sensor elements including at least one of said sensor dies and first bond pads;
placing said sensor elements in an array arranged to correspond with locations of controller dies in a controller wafer, said controller wafer having a top side and a bottom side opposing said top side, said top side including said controller dies, each of said controller dies including second bond pads, a first surface area of each of said controller dies being greater than a second surface area of each of said sensor dies, and said placing operation includes distributing said sensor elements in said array to align said sensor dies with said controller dies;
encapsulating said array in a mold material to form a panel of said sensor elements, wherein said first bond pads are concealed by at least one of said controller wafer and a portion of said panel;
bonding said bottom side of said controller wafer to an outer surface of said panel to form a stacked wafer structure of said controller dies and said sensor elements;
following said bonding operation, removing a material section from said at least one of said controller wafer and said portion of said panel of said stacked wafer structure to expose said first bond pads;
forming electrical interconnects between said first and second bond pads; and
dicing said stacked wafer structure to produce said sensor packages.

13. A method as claimed in claim 12 wherein:
said sensor wafer comprises a sensor wafer structure that includes said sensor dies arranged in pairs in said sensor wafer structure, wherein said first bond pads of a first sensor die are adjacent to said first bond pads of a second sensor die in each of said pairs of said sensor dies; and
said dicing said sensor wafer comprises producing said sensor elements in the form of said pairs of said sensor dies for placement in said array.

14. A method as claimed in claim 12 wherein:
said sensor wafer comprises a sensor wafer structure that includes said sensor wafer and a cap wafer, a first inner surface of said cap wafer is coupled to a second inner surface of said sensor wafer, a first one of said cap wafer and said sensor wafer includes a substrate portion with said first bond pads being formed on a corresponding one of said first and second inner surfaces, and a second one of said cap wafer and said sensor wafer conceals said substrate portion, and seal members extend between said sensor wafer and said cap wafer, at least a portion of said seal members being positioned between said first bond pads and saw lines of said sensor wafer structure; and
said dicing said sensor wafer includes dicing said sensor wafer structure to produce said sensor elements in the form of singulated ones of said sensor dies for placement in said array, said seal members shielding said first bond pads from contaminants when said sensor wafer structure is diced along said saw lines.

15. A method as claimed in claim 12 wherein said removing operation comprises removing first material from said controller wafer of said stacked wafer structure and removing second material coincident with said first material from said second one of said sensor wafer and said cap wafer to expose said substrate portion having said first bond pads.

16. A method of forming electronic component packages comprising:
dicing a first wafer to produce first electronic components, said first wafer including a plurality of said first electronic components, each of said first electronic components including first bond pads;
placing said first electronic components in an array arranged to correspond with locations of second electronic components formed on a second wafer, each of said second electronic components including second bond pads;
encapsulating said array in a mold material to form a panel of said first electronic components;

bonding a bottom side of said second wafer to an outer surface of said panel to form a stacked wafer structure of said first and second electronic components, said first bond pads being concealed by at least one of said wafer and a portion of said panel;

following said bonding operation, removing a material section from said at least one of said wafer and said portion of said panel of said first electronic components to expose said first bond pads;

forming electrical interconnects between said first and second bond pads; and dicing said stacked wafer structure to produce said electronic component packages.

17. A method as claimed in claim 16 wherein:

said first wafer comprises a sensor wafer structure that includes a sensor wafer and a cap wafer, wherein each of said first electronic components includes a sensor die having a sensor located on said sensor wafer, a first inner surface of said cap wafer is coupled to a second inner surface of said sensor wafer, a first one of said cap wafer and said sensor wafer includes a substrate portion having said first bond pads formed on a corresponding one of said first and second inner surfaces, and a second one of said cap wafer and said sensor wafer conceals said substrate portion; and said removing operation comprises removing first material from said sensor wafer of said stacked wafer structure and removing second material coincident with said first material from said second one of said sensor wafer and said cap wafer to expose said substrate portion having said first bond pads.

18. A method as claimed in claim 16 wherein said forming said electrical interconnects is performed prior to said dicing operation, and said method further comprises:

applying a packaging material over said top side of said second wafer to encapsulate said second electronic components and said electrical interconnects; and performing said dicing operation following said applying operation.

\* \* \* \* \*